(12) United States Patent
Lin

(10) Patent No.: US 12,230,598 B2
(45) Date of Patent: Feb. 18, 2025

(54) SEMICONDUCTOR PACKAGE

(71) Applicant: MEDIATEK Inc., Hsin-Chu (TW)

(72) Inventor: You-Wei Lin, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 348 days.

(21) Appl. No.: 17/667,773

(22) Filed: Feb. 9, 2022

(65) Prior Publication Data

US 2022/0270997 A1 Aug. 25, 2022

Related U.S. Application Data

(60) Provisional application No. 63/165,307, filed on Mar. 24, 2021, provisional application No. 63/200,210, filed on Feb. 22, 2021.

(51) Int. Cl.
*H01L 23/00* (2006.01)
*H01L 23/498* (2006.01)

(52) U.S. Cl.
CPC ........ *H01L 24/29* (2013.01); *H01L 23/49827* (2013.01); *H01L 23/49861* (2013.01); *H01L 24/45* (2013.01); *H01L 2224/2902* (2013.01); *H01L 2224/45099* (2013.01)

(58) Field of Classification Search
CPC ............................ H01L 25/105; H01L 25/065; H01L 23/49575
See application file for complete search history.

(56) References Cited

U.S. PATENT DOCUMENTS

| | | | |
|---|---|---|---|
| 2005/0194673 A1* | 9/2005 | Kwon | H01L 24/49 257/E29.022 |
| 2006/0138649 A1 | 6/2006 | Karnezos | |
| 2006/0175715 A1* | 8/2006 | Hirose | H01L 25/0657 257/E25.023 |
| 2009/0001563 A1 | 1/2009 | Bathan et al. | |
| 2009/0236755 A1 | 9/2009 | Wu et al. | |
| 2012/0326304 A1 | 12/2012 | Warren et al. | |

OTHER PUBLICATIONS

EP Search Report dated Jul. 19, 2022 in European application No. 22158074.9-1212.

* cited by examiner

*Primary Examiner* — Yu-Hsi D Sun
(74) *Attorney, Agent, or Firm* — McClure, Qualey & Rodack, LLP

(57) ABSTRACT

A semiconductor package includes a carrier, a package module and a second package body. The package module is disposed on the carrier and includes a first substrate, a first electronic element, a first conductive wire and a first package body. The first substrate has a first electrical surface facing the carrier and a second electrical surface opposite to the first electrical surface. The first electronic element is disposed on the first electrical surface. The first conductive wire connects the electronic element with the first electrical surface of the first substrate. The first package body encapsulates the first electrical surface, the first electronic element and the first solder wire. The second package body encapsulates the package module and a portion of the carrier.

14 Claims, 5 Drawing Sheets

SEMICONDUCTOR PACKAGE

This application claims the benefit of U.S. Provisional application Ser. No. 63/200,210, filed Feb. 22, 2021, and U.S. Provisional application Ser. No. 63/165,307, filed Mar. 24, 2021, the disclosure of which are incorporated by reference herein in its entirety.

FIELD OF THE INVENTION

The invention relates to a semiconductor package, and more particularly to a semiconductor package including a package module.

BACKGROUND OF THE INVENTION

Conventional semiconductor package includes a lead frame, a chip and a plurality of solder wires. The chip is disposed on the lead frame, and the solder wires electrically connect the chip with the lead frame. However, the conductive wires are boned to the lead frame which is thin, and thus it cause unreliability of bonding. Thus, how to bond the conductive wire in a way of reliability has become a prominent task for the industries.

SUMMARY OF THE INVENTION

In an embodiment of the invention, a semiconductor package is provided. The semiconductor package includes a carrier, a package module and a second package body. The first package module is disposed on the carrier and includes a first substrate, a first electronic element, a first conductive wire and a first package body. The first substrate has a first electrical surface facing the carrier and a second electrical surface opposite to the first electrical surface. The first electronic element is disposed on the first electrical surface. The first conductive wire connects the electronic element with the first electrical surface of the first substrate. The first package body encapsulates the first electrical surface, the first electronic element and the first solder wire. The second package body encapsulates the package module and a portion of the carrier.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1:
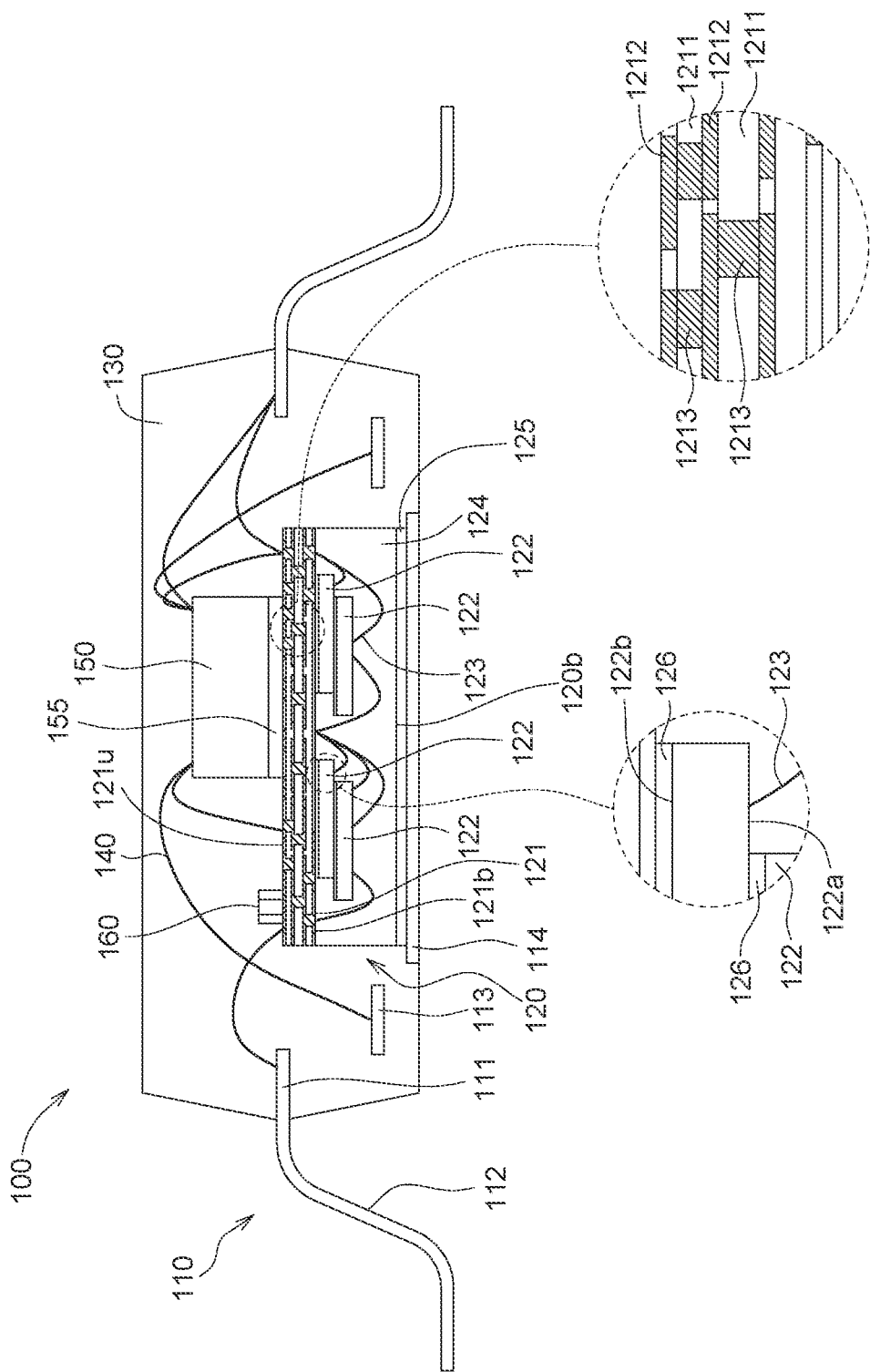
FIG. 1 illustrates a diagram view of a semiconductor package according to an embodiment of the invention.
Figure 2:
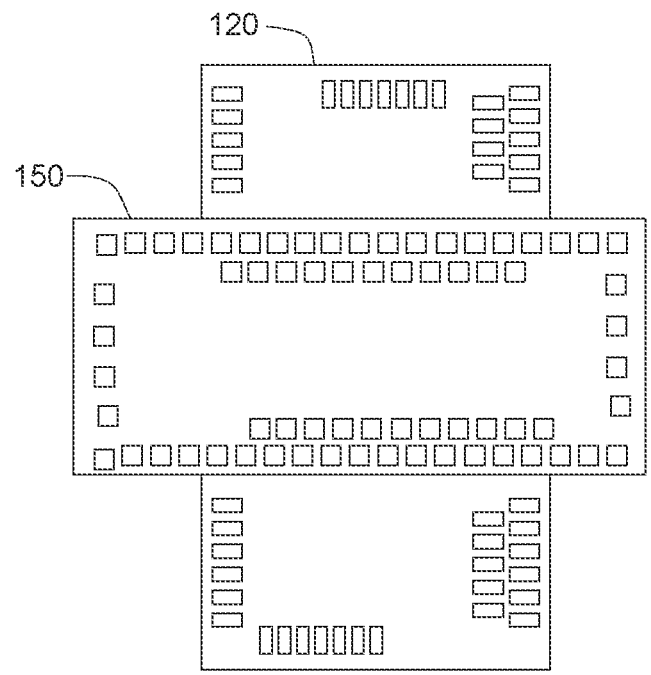
FIGS. 2 and 3 illustrates top views of configuration relationships between the package module and the second electronic element of FIG. 1.
Figure 3:
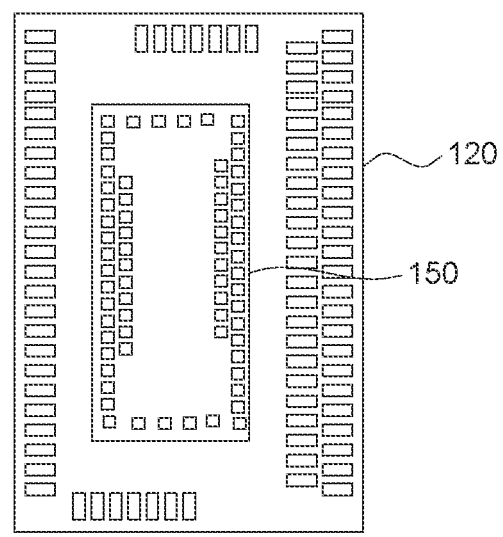

Referring to FIGS. 1 to 3, FIG. 1 illustrates a diagram view of a semiconductor package 100 according to an embodiment of the invention, and FIGS. 2 and 3 illustrate top views of configuration relationships between the package module 120 and the second electronic element 150 of FIG. 1.

As illustrated in FIG. 1, the semiconductor package 100 includes a carrier 110, a package module 120, a first adhesive layer 125, a second package body 130, at least one second conductive wire 140, at least one second electronic element 150, a second adhesive layer 155 and at least one third electronic element 160. In the present embodiment, the conductive wire could be made of a material including, for example, Au, Ag, Cu, Ni, etc.

The package module 120 is disposed on the carrier 110 and includes a first substrate 121, at least one first electronic element 122, at least one first conductive wire 123 and a first package body 124. The first substrate 121 has a first electrical surface 121b facing the carrier 110 and a second electrical surface 121u opposite to the first electrical surface 121b. The first electronic elements 122 are disposed on the first electrical surface 121b. The first conductive wires 123 connect the first electronic elements 122 with the first electrical surface 121b of the first substrate 121. The first package body 124 encapsulates the first electrical surface 121b, the first electronic element 122 and the first conductive wires 123. The second package body 130 encapsulates the package module 120 and a portion of the carrier 110.

Compared to the conductive wire being bonded to the carrier 110, the conductive wire could more reliably (or steadily) be boned to the package module 120. In other words, due to the package module 120 provides a steady platform, it could increase the stability of the wire bonding and reduce the complexity of the wire bonding. In addition, due to the electronic elements 122 being embedded in the first package body 124 in advance, the required number of the second conductive wires 140 could be reduced and/or it could reduce the complexity of the wire bonding.

The carrier 110 is, for example, lead frame. The carrier 110 includes a plurality of inner leads 111, a plurality of outer leads 112, a grounding ring 113 and a die pad 114, wherein each the outer lead 112 is connected to the corresponding inner lead 111, and the grounding ring 113 could be connected to one or some of the inner leads 111. The inner leads 111 and the grounding ring 113 are encapsulated by the second package body 130, and the outer leads 112 protrude relative to the second package body 130 for electrically connected with an external electronic device. For example, Printed Circuit Board (PCB). The die pad 114 could carry the package module 120.

The package module 120 further has a package surface 120b away from the second electrical surface 121u. The package surface 120b faces the carrier 110, and the second electrical surface 121u faces away from the carrier 110.

The first substrate 121 has, for example, single-layered structure or multi-layered structure. In the present embodiment, the first substrate 121 has multi-layered structure including at least one dielectric layer 1211, at least one conductive layer 1212 and at least one conductive via 1213. In addition, the dielectric layer 1211 could be made of a material of non-conductive material, for example, epoxy or resin. Two of the conductive layers 1212 are separated from each other by one of the dielectric layers 1211, and electrically connected with each other by one of the conductive vias 1213. Each conductive layer 1212 includes at least one trace, and at least one conductive via 1213 connects with the traces of the conductive layers 1212. In addition, the bottommost conductive layer 1212 includes at least one trace and/or pad which form the first electrical surface 121b, and the bottommost conductive layer 1212 could be covered by solder mask (not illustrated) exposing the pad. The topmost dielectric layer 1212 includes at least one trace and/or pad which form the second electrical surface 121u, and the topmost conductive layer 1212 could be covered by solder mask (not illustrated) exposing the pad.

In another embodiment, the first substrate 121 is, for example, a PCB, interposer, etc.; however, such exemplification is not meant to be for limiting.

Some of the first electronic elements 122 could be stacked each other and/or a group of the stacked first electronic elements 122 and another group of the stacked first electronic elements 122 are disposed side by side. The number of a group of the stacked first electronic elements 122 is, for example, two, three or more. The number of the stacked group including the stacked first electronic elements 122 is, for example, one, two, three or more. In another embodiment, two first electronic elements 122 on which no first electronic element 122 is stacked are disposed with side by side, or one first electronic element 122 on which no first electronic element 122 is stacked and one stacked group of are disposed with side by side.

The first electronic element 122 is, for example, memory chip, Sop (System on a Chip), etc.; however, such exemplification is not meant to be for limiting. In addition, the first electronic element 122 has an active surface 122a facing the carrier 110, that is, the first electronic element 122 is disposed in a reverse orientation and at least one of the first conductive wire 123 electrically connects the active surface 122a of at least one of the first electronic elements 122 with the first electrical surface 121b. The first electronic element 122 has a back surface 122b opposite to the active surface 122a, and the back surface 122b faces the first substrate 121. In addition, the package module 120 further includes at least one adhesive layer 126 disposed between the active surface 122a of the electronic element 122 with the back surface 122b of the electronic element 122.

At least one of the first conductive wires 123 electrically connect the first electronic elements 122 with the first electrical surface 121b of the first substrate 121. For example, at least one of the first conductive wires 123 connects the first electronic elements 122 with the bottommost conductive layers 1212 forming the first electrical surface 121b. In another, at least one of the first conductive wires 123 electrically connect two of the first electronic elements 122.

The first package body 124 has the package surface 120b. The package body 124 could be made of a material including, for example, a Novolac-based resin, an epoxy-based resin, a silicone-based resin, or another suitable encapsulant. Suitable fillers also can be included, such as powdered SiO2. The package body 124 could be applied using any of a number of molding techniques, such as compression molding, injection molding, or transfer molding.

The first adhesive layer 125 is disposed between the package module 120 and the carrier 110. Furthermore, the first adhesive layer 125 is disposed between the package surface 120b of the package module 120 and the die pad 114 of the carrier 110 for fixing the relative position between the carrier 110 and the package module 120.

The second package body 130 encapsulates the package module 120, a portion of the carrier 110, the second conductive wires 140, the second electronic element 150 and the third electronic element 160. The second package body 130 could be made of a material the same as or similar to the first package body 124.

At least one of the second conductive wires 140 connect the package module 120 with the second electrical surface 121u of the first substrate 121 of the package module 120. For example, at least one of the second conductive wires 140 connect the package module 120 with the topmost dielectric layer 1212 forming the second electrical surface 121u. In addition, one of some of the second conductive wires 140 electrically connect the grounding ring 113 with the second electronic element 150.

The second electronic element 150 is, for example, active chip, such as a SoC, etc. The second electronic element 150 is disposed on the second electrical surface 121u.

The second adhesive layer 155 is disposed between the package module 120 and the second electronic element 150. Furthermore, the second adhesive layer 155 is disposed between the second electrical surface 121u of the package module 120 and the second electronic element 150 for fixing the relative position between the second electronic element 150 and the package module 120.

The third electronic element 160 is, for example, passive element, such as resistor, inductor and/or capacitor; however, such exemplification is not meant to be for limiting. The third electronic element 160 is disposed on the second electrical surface 121u.

As illustrated in FIGS. 2 and 3, at least one portion of the second electronic element 150 could overlap the package module 120. For example, in FIG. 2, a portion of the second electronic element 150 is disposed over the package module 120. In FIG. 3, the entire of the second electronic element 150 is disposed over the package module 120. The position of the second electronic element 150 could be determined according to design of the wire bonding.

Figure 4:
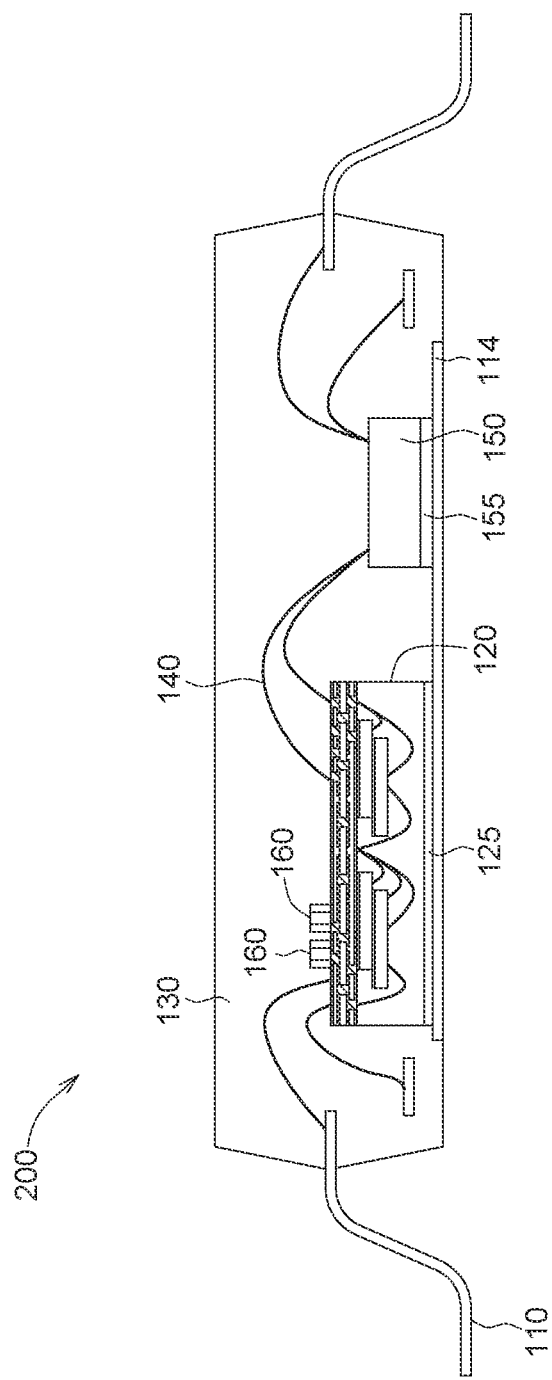
FIG. 4 illustrates a diagram view of a semiconductor package according to another embodiment of the invention.

Referring to FIG. 4, FIG. 4 illustrates a diagram view of a semiconductor package 200 according to another embodiment of the invention.

The semiconductor package 200 includes the carrier 110, the package module 120, the first adhesive layer 125, the second package body 130, at least one second conductive wire 140, at least one second electronic element 150, the second adhesive layer 155 and at least one third electronic element 160.

The semiconductor package 200 includes the features the same as or similar to that of the semiconductor package 100 expect that the second electronic element 150 and the package module 120 are disposed on the die pad 114 of the carrier 110 side by side.

Figure 5:
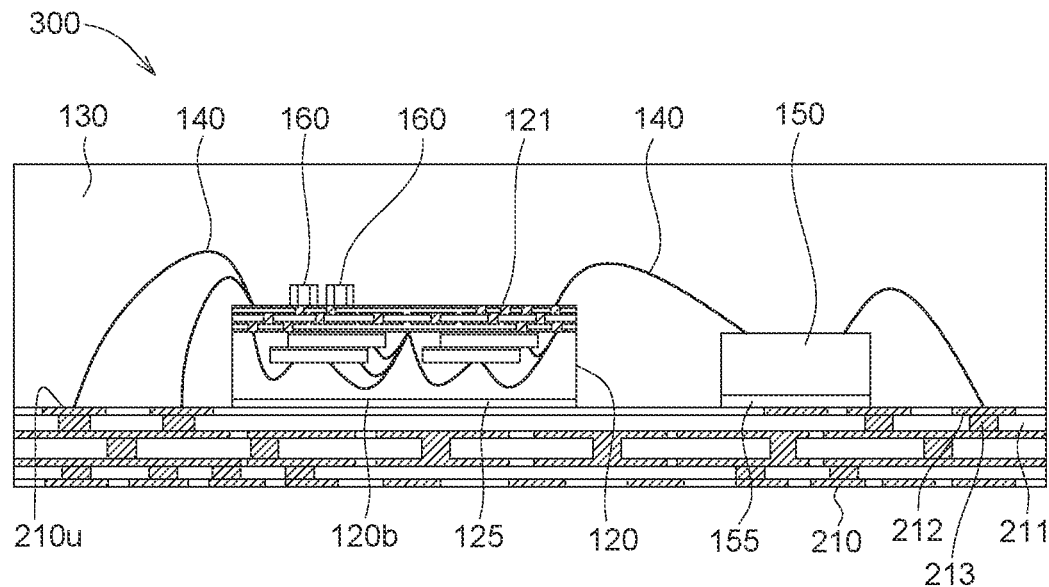
FIG. 5 illustrates a diagram view of a semiconductor package according to another embodiment of the invention.

Referring to FIG. 5, FIG. 5 illustrates a diagram view of a semiconductor package 300 according to another embodiment of the invention.

The semiconductor package 300 includes a carrier 210, the package module 120, the first adhesive layer 125, the second package body 130, at least one second conductive wire 140, at least one second electronic element 150, the second adhesive layer 155 and at least one third electronic element 160.

The semiconductor package 300 includes the features the same as or similar to that of the semiconductor package 200 expect that the carrier 210 has the structure different from that of the carrier 110. In the present embodiment, the carrier 210 is a second substrate including the structure the same as or similar to that of the first substrate 121 of the package module 120.

The carrier 210 has, for example, single-layered structure or multi-layered structure. In the present embodiment, the carrier 210 has multi-layered structure including at least one dielectric layer 211, at least one conductive layer 212 and at least one conductive via 213. In addition, the dielectric layer 211 could be made of a material of non-conductive material, for example, epoxy or resin. Two of the conductive layers 212 are separated from each other by one of the dielectric layers 211, and electrically connected with each other by one of the conductive vias 213.

In addition, the first adhesive layer 125 is disposed between the carrier 210 and package surface 120b of the package module 120 for fixing the relative position between the carrier 210 and the second electronic element 150. The second adhesive layer 155 is disposed between the carrier 210 and the second electronic element 150 for fixing the relative position between the carrier 210 and the second electronic element 150.

The carrier 210 has a third electrical surface 210u. The second package body 130 encapsulates the third electrical surface 210u of the carrier 210. The third electrical surface 210u is entirely covered by, for example, the package module 120 and the second electronic element 150 and the second package body 130.

Figure 6:
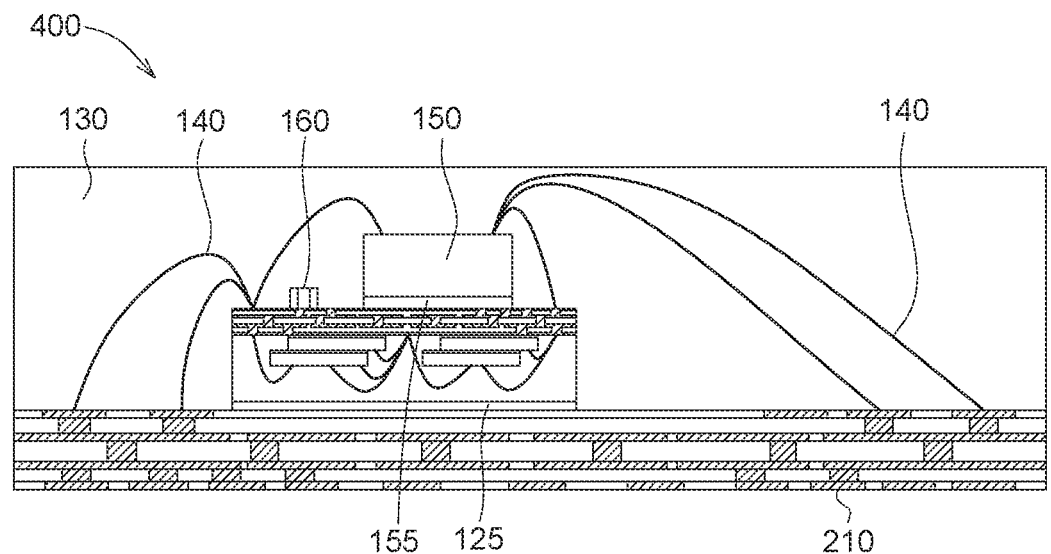
FIG. 6 illustrates a diagram view of a semiconductor package according to another embodiment of the invention.

Referring to FIG. 6, FIG. 6 illustrates a diagram view of a semiconductor package 400 according to another embodiment of the invention.

The semiconductor package 400 includes the carrier 210, the package module 120, the first adhesive layer 125, the second package body 130, at least one second conductive wire 140, at least one second electronic element 150, the second adhesive layer 155 and at least one third electronic element 160.

The semiconductor package 400 includes the features the same as or similar to that of the semiconductor package 300 expect that the second electronic element 150 and the package module 120 are stacked to each other.

Figure 7A:
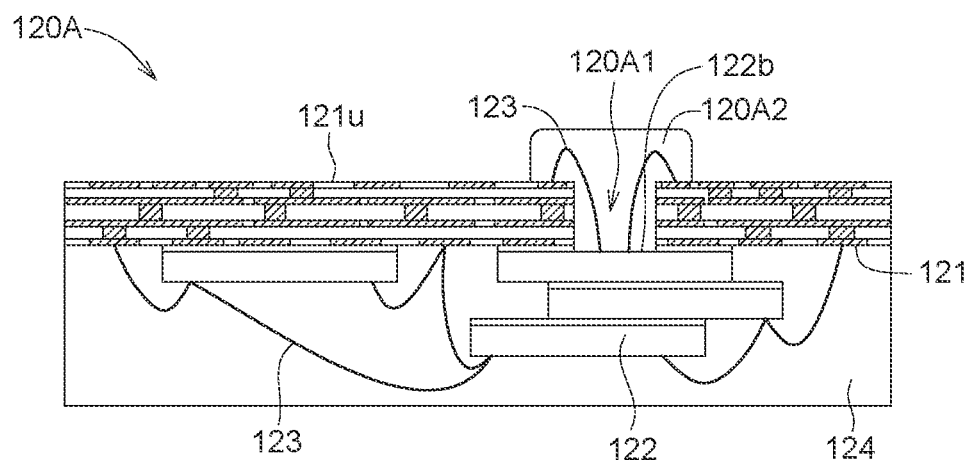
FIGS. 7A to 7B illustrate diagram views of some package modules according to some embodiments of the invention.
Figure 7B:
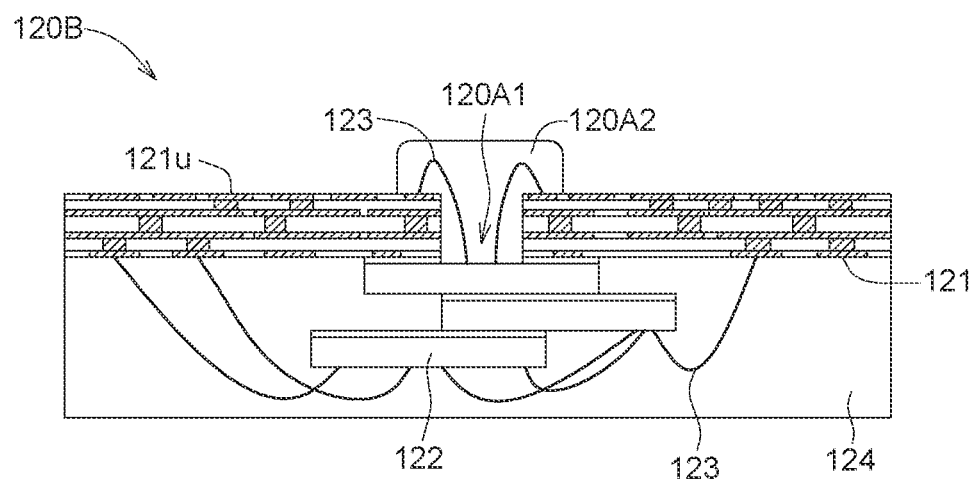

Referring to FIGS. 7A to 7B, FIGS. 7A to 7B illustrate diagram views of some package modules 120A to 120B according to some embodiments of the invention.

The package module 120 of each of the semiconductor packages 100 to 400 could be replaced by one of the package modules 120A and 120B.

As illustrated in FIGS. 7A and 7B, the first substrate 121 of the package modules 120A has a through hole 120A1 and further includes a plug 120A2 filling up the through hole 120A1. The plug 120A2 protrudes respect to the second electrical surface 121u of the first substrate 121 and covers a portion of the second electrical surface 121u. In addition, in the present embodiment, the back surface 122b of the first electronic elements 122 is, for example, active surface. At least one of the first electronic elements 122 electrically connects with the second electrical surface 121u by one or some of the first conductive wires 123 encapsulated by the plug 120A2.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor package, comprising:
    a carrier comprising a lead frame, wherein the carrier comprises an outer lead, an inner lead, a grounding ring and a die pad;
    a package module disposed on the carrier, comprising:
    a first substrate having a first electrical surface facing the carrier and a second electrical surface opposite to the first electrical surface;
    a first electronic element disposed on the first electrical surface;
    a first conductive wire connecting the electronic element with the first electrical surface of the first substrate;
    a grounding conductive wire electrically connected to the grounding ring and the second electrical surface of the first substrate;
    a first package body encapsulating the first electrical surface, the first electronic element and the first solder wire; and
    a second package body encapsulating the package module and a portion of the carrier.

2. The semiconductor package as claimed in claim 1, further comprises:
    a second conductive wire connecting the package module with the second electrical surface of the first substrate.

3. The semiconductor package as claimed in claim 1, further comprises a plurality of the first electronic elements and a plurality of the first conductive wires, and one of the first conductive wires connects one of the first electronic elements with another of the first electronic elements.

4. The semiconductor package as claimed in claim 1, further comprises:
    a second electronic element disposed on the package module; and
    wherein the second conductive wire connecting the second electronic element with the second electrical surface of the first substrate.

5. The semiconductor package as claimed in claim 1, wherein the first package body has a package surface; the semiconductor package further comprises:
    an adhesive disposed between the package surface and the carrier.

6. The semiconductor package as claimed in claim 1, wherein the first electronic element has an active surface facing the carrier, and the first conductive wire electrically connects the active surface with the first electrical surface.

7. The semiconductor package as claimed in claim 1, further comprises:
    a first adhesive layer disposed between the carrier and the package module.

8. The semiconductor package as claimed in claim 1, further comprises:
    a second adhesive layer disposed between the package module and a second electronic element disposed on the package module.

9. The semiconductor package as claimed in claim 1, further comprising:
    a second electronic element;
    wherein the package module and the second electronic element are disposed on the die pad.

10. The semiconductor package as claimed in claim 1, further comprising:
    a second electronic element electrically connected to the grounding ring.

11. The semiconductor package as claimed in claim 1, further comprising:
- a second electronic element; and
- a third conductive wire;
- wherein the second electronic element is connected to the inner lead by the third conductive wire.

12. The semiconductor package as claimed in claim 1, wherein the second electrical element partially covers the second electrical surface of the first substrate.

13. The semiconductor package as claimed in claim 1, wherein the first substrate of the package modules has a through hole and further comprises a plug filling up the through hole.

14. The semiconductor package as claimed in claim 13, wherein the plug protrudes relative to the second electrical surface of the first substrate and covers a portion of the second electrical surface.

* * * * *